(12) United States Patent
Jang et al.

(10) Patent No.: US 9,257,389 B2
(45) Date of Patent: Feb. 9, 2016

(54) SEMICONDUCTOR DEVICE HAVING METAL INTERCONNECTIONS

(71) Applicant: SAMSUNG ELECTRONICS CO., LTD., Gyeonggi-do (KR)

(72) Inventors: WooJin Jang, Gyeonggi-do (KR); Kyoungwoo Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/448,115

(22) Filed: Jul. 31, 2014

(65) Prior Publication Data

US 2014/0339701 A1 Nov. 20, 2014

Related U.S. Application Data

(63) Continuation of application No. 13/431,446, filed on Mar. 27, 2012, now Pat. No. 8,828,865.

(30) Foreign Application Priority Data

Mar. 28, 2011 (KR) .......................... 10-2011-0027727

(51) Int. Cl.
*H01L 23/48* (2006.01)
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/76834* (2013.01); *H01L 21/76849* (2013.01); *H01L 21/76883* (2013.01); *H01L 23/481* (2013.01); *H01L 23/53228* (2013.01); *H01L 23/53238* (2013.01); *H01L 2224/13* (2013.01)

(58) Field of Classification Search
None
See application file for complete search history.

(56) References Cited

U.S. PATENT DOCUMENTS

| 6,107,687 A * | 8/2000 | Fukada et al. ................. 257/762 |
| 2006/0205204 A1 | 9/2006 | Beck |
| 2008/0157380 A1* | 7/2008 | Hong ............................ 257/751 |

FOREIGN PATENT DOCUMENTS

| KR | 1020050122639 | 12/2005 |
| KR | 1020080061030 | 7/2008 |

* cited by examiner

*Primary Examiner* — Daniel Whalen
(74) *Attorney, Agent, or Firm* — F. Chau & Associates, LLC

(57) ABSTRACT

A method of forming a metal interconnection of semiconductor device is provided. The method includes forming a low-k dielectric layer including an opening; forming a barrier metal pattern conformally covering a bottom surface and an inner sidewall of the opening; forming a metal pattern exposing a part of the inner sidewall of the barrier metal pattern in the opening; forming a metal capping layer on the top surfaces of the metal pattern and the low-k dielectric layer using a selective chemical vapor deposition process, wherein the thickness of the metal capping layer on the metal pattern is greater than the thickness of the metal capping layer on the low-k dielectric layer; and forming a metal capping pattern covering the top surface of the metal pattern by planarizing the metal capping layer down to the top surface of the low-k dielectric layer.

9 Claims, 5 Drawing Sheets

SEMICONDUCTOR DEVICE HAVING METAL INTERCONNECTIONS

CROSS-REFERENCE TO RELATED APPLICATIONS

This U.S. non-provisional patent application is a continuation of U.S. patent application Ser. No. 13/431,446, filed on Mar. 27, 2012; this U.S. none provisional patent application claims priority under 35 U.S.C. §119 of Korean Patent Application No. 10-2011-0027727, filed on Mar. 28, 2011, the entire contents of which are hereby incorporated by reference.

TECHNICAL FIELD

The present inventive concept herein relates to methods of manufacturing semiconductor devices, and more particularly, to a method of forming a metal interconnection of a semiconductor device having improved reliability.

As integrated circuits are developed, semiconductor devices capable of high speed operation and high integration are required. As one of many technologies developed to satisfy the need for high speed operation and high integration of semiconductor devices, a semiconductor device having a line width of a several tens of nanometers has been developed and commercialized. However, high speed operation is difficult to achieve since both resistance of the metal interconnection is increased and the capacitance between metal interconnections is increased, due to the reduction in critical dimension (CD).

To solve these problems, it is desirable to reduce the resistance of the interconnections and the dielectric constant of the interlayer insulating films. Thus, copper can be used as interconnection material, since copper has a lower resistivity and exhibits less electromigration as compared with aluminum.

SUMMARY

In one embodiment the inventive concept provides a method of forming a metal interconnection of semiconductor device. The method includes forming a low-k dielectric layer including an opening; forming a barrier metal pattern conformally covering a bottom surface and an inner sidewall of the opening; forming a metal pattern exposing a part of the inner sidewall of the harrier metal pattern in the opening; forming a metal capping layer on top surfaces of the metal pattern and the low-k dielectric layer using a selective chemical vapor deposition process, wherein the thickness of the metal capping layer on the metal pattern is greater than the thickness of the metal capping layer on the low-k dielectric layer; and forming a metal capping pattern covering a top surface of the metal pattern by planarizing the metal capping layer down to a top surface of the low-k dielectric layer.

In one embodiment the inventive concept also provides a method of forming a metal interconnection of a semiconductor device. The method includes forming a low-k dielectric layer including an opening; conformally forming a barrier metal layer on the low-k dielectric layer including the opening; forming a metal layer filling the opening on the barrier metal layer; forming a barrier metal pattern and a metal pattern locally in the opening by planarizing the metal layer and the barrier metal layer down to a top surface of the low-k dielectric layer; exposing a part of an inner wall of the barrier metal pattern by recessing a top surface of the metal pattern; selectively depositing a metal capping layer on a top surface of the recessed metal pattern and a top surface of the low-k dielectric layer, wherein the thickness of the metal capping layer on the metal pattern is greater than the thickness of the metal capping layer on the low-k dielectric layer; and forming a metal capping pattern covering a top surface of the metal pattern by planarizing the metal capping layer down to a top surface of the low-k dielectric layer.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention, in the drawings, the thickness of layers and regions are exaggerated for clarity.

DETAILED DESCRIPTION OF THE EMBODIMENTS

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

The terminology used herein is for the purpose of describing particular embodiments only and is not intended to be limiting of the invention. As used herein, the singular forms "a", an and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

FIGS. 1 through 8 are cross sectional views illustrating a method of manufacturing a semiconductor device in accordance with an embodiment of the inventive concept.

Figure 1:
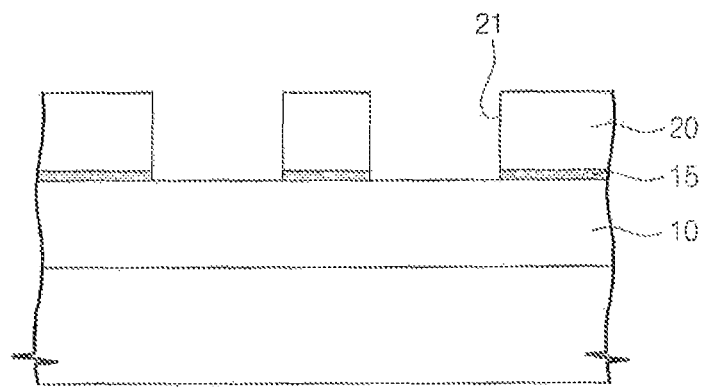
FIGS. 1 through 8 are cross sectional views illustrating a method of manufacturing a semiconductor device in accordance with an embodiment of the inventive concept.

Referring to FIG. 1, a low-k dielectric layer 20 including openings 21 may be formed on a lower layer.

The lower layer 10 may include a semiconductor substrate and laminated insulating layers. The lower layer 10 may be another low-k dielectric layer having low-k and may be an inter-metal dielectric (IMD). The lower layer 10 may cover semiconductor devices (e.g., transistors, capacitors and resistors) and lower interconnections. Also, an etch-stop layer 15 may be formed between the lower layer 10 and the low-k dielectric layer 20.

The low-k dielectric layer 20 is comprised of at least one layer and may include dielectric material having a dielectric constant lower than that of a silicon oxide layer. In one embodiment, the low-k dielectric layer 20 has a dielectric constant of from about 2.0 to about 3.0. The low-k dielectric layer 20 may include an organic polymer having low-k or an oxide layer system doped with an impurity.

The oxide layer system doped with an impurity can be a fluorine-doped oxide, an oxide layer doped with carbon, a silicon oxide layer, hydrogen silsesquioxane (SiO:H), methyl ilsesquioxane (SiO:CH3) or a-SiOC (SiOC:H). Any one or more of a polyallylether system resin, a cyclic fluoroplastic, a siloxane interpolymer, a polyallylether fluoride resin, a polypentafluorostylene, a polytetrafluorostylene resin, a polyimide fluoride resin, a polynaphthalene fluoride, or a polycide resin can be used as an organic polymer having a low dielectric constant. The etch-stop layer 15 can include SiN, SiON, SiC, BN (Boron nitride) or any combination thereof. The low-k dielectric layer 20 and the etch-stop layer 15 can be formed using a plasma enhanced CVD (PECVD), a high density plasma CVD (HDP-CVD), an atmospheric pressure CVD (APCVD) and a spin coating.

The opening 21 is a region at which a metal interconnection is formed and can be provided by forming a mask pattern (not illustrated) on the low-k dielectric layer 20, and then anisotropically etching the low-k dielectric layer 20 using the mask pattern. The opening 21 may penetrate at least one dielectric layer to expose the lower layer 10. The space between the openings 21 may vary depending on the line width of the semiconductor device and the capacitance between the metal interconnections. Also, the opening 21 may expose a part of the semiconductor device (not illustrated) or a part of the lower interconnection (not illustrated) buried by the lower layer 10.

Figure 2:
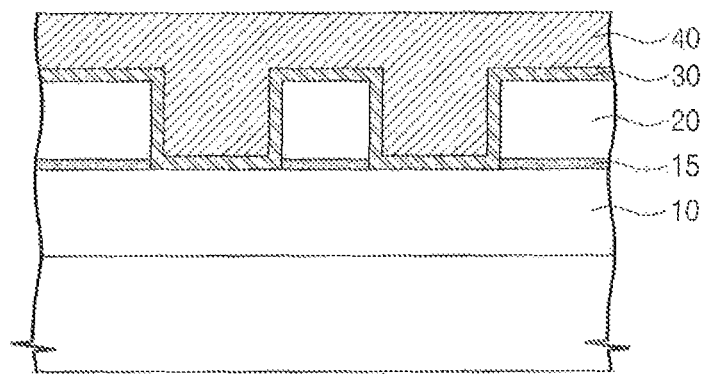

Referring to FIG. 2, a barrier metal layer 30 may be conformally formed on the surface of the low-k dielectric layer 20 including the opening 21. That is, the barrier metal layer 30 may uniformly cover a bottom surface and an inner surface of the opening 21 and a top surface of the low-k dielectric layer 20. The barrier metal layer 30 can be firmed from material that can prevent a metal layer 40 being buried in the opening 21 from diffusing into the low-k dielectric layer 20 around the harrier metal layer 30. For example, the barrier metal layer 30 may include one or more metals or compounds selected from the group consisting of Ta, TaN, TaSiN, Ti, TiN, TiSiN, W and WN. Further, the barrier metal layer 30 can have a thickness of from about 5 Å to about 50 Å. The harrier metal layer 30 can be formed using a chemical vapor deposition (CVD), an atomic layer deposition (All or a physical vapor deposition (PVD) like sputtering.

The metal layer 40 filling the openings 21 may be formed on the barrier metal layer 30, in one embodiment, the metal layer 40 may be formed from copper or copper alloy. Herein, the copper alloy means copper mixed with a small amount of one or more of the following elements: C, Ag, Co, Ta, In, Sn, Zn, Mn, Ti, Mg, Cr, Ge, Sr, Pt, Mg, Al or Zr.

The metal layer 40 can be formed using an electroplating or an electroless plating. When the metal layer 40 is formed using an electroplating, a seed layer (not illustrated) can be formed on a surface of the barrier metal layer 30, The seed layer may increase uniformity of a plating layer and may thereby function as an initial nucleation site. One or more metals selected from Cu, Au, Ag, Pt and Pd can be used as the seed layer and material being used as the seed layer may be different depending on the plating method and the kind of metal forming layer 40. The metal layer 40 formed by a plating method may be formed on the low-k dielectric layer 20 while filling the openings 21.

Figure 3:
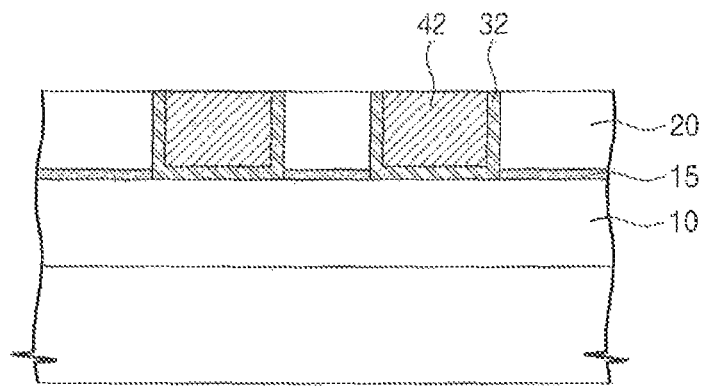
Figure 4:
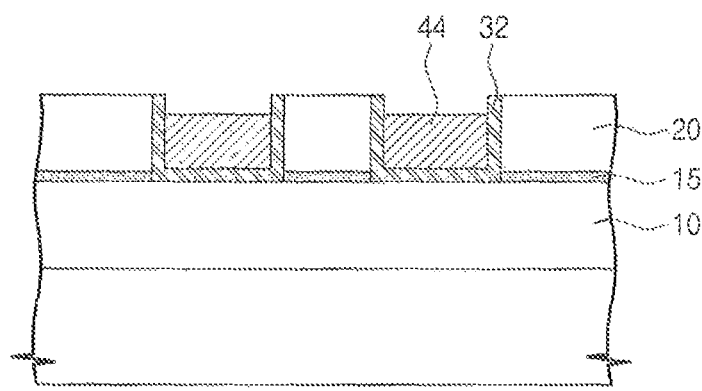

Referring to FIG. 3, a metal pattern 42 is locally formed in each of the openings 21 by performing a planarization process on the metal layer 40.

In one embodiment of the inventive concept, a planarization process can be performed on the metal layer 40 down to a top surface of the barrier metal layer 30. Further, a planarization process may be performed down to a top surface of the low-k dielectric layer 20 and in this case, a barrier metal pattern 32 may be formed together with the metal pattern 42 in each of the openings 21. In one embodiment, a planarization process is performed on a part of the metal layer 40 and in this case, a part of the metal layer 40 may remain on a top surface of the low-k dielectric layer 20. That is, the metal layer 40 may remain on the low-k dielectric layer 20 between the openings 21.

In one embodiment, a chemical mechanical polishing (CMP) process can be used as a planarization process. Herein, the CMP process is a technology that the metal layer 40 is physically planarization-etched by rotating a polishing pad and/or the metal layer 40 while causing a slurry to chemically react to a surface of the metal layer 40 by providing the slurry onto the metal layer 40 such that a surface of the metal layer 40 is in contact with a surface of the polishing pad.

In the CMP process, a removal rate of the metal layer 40 is determined on the basis of various factors such as the slurry type; the construction of the polishing pad; the structure and type of polishing pad; the of relative movement between the polishing pad and the metal layer 40; the pressure applied to the metal layer 40 by the polishing pad; the type of the metal layer 40 to be polished, etc. and other such considerations that will be immediately apparent to those of skill in the art. Also, the slurry used in performing the CMP process can be selected to have the best polishing property relative to material being polished and to have a different removal rate depending on the particular slurry composition.

In one embodiment, when a CMP process is performed, the slurry is chosen such that the removal rate of the barrier metal layer 30 is the same as the removal rate of the metal layer 40; alternatively, the slurry can be chosen such that the removal rate of the metal layer 40 is greater than a removal rate of the barrier metal layer 30. For example, silica slurry, ceria slurry, mangania slurry, alumina slurry, titanic slurry, zirconia, germania or combinations thereof can be used as the slurry.

Subsequently, a top surface of the metal patterns 42 is recessed using an etching composition having an etching selectivity with respect to the low-k dielectric layer 20 and the barrier metal pattern 32. As the top surfaces of the metal patterns 42 are recessed, (See FIG. 4), a part of inner wall of the barrier metal pattern 32 formed in the opening 21 may be exposed.

According to one embodiment, the top surfaces of the metal patterns 42 including copper may be recessed using an isotropic etching process. Also, as the isotropic etching process is performed, metal particles (such as copper particles) remaining on a surface of the low-k dielectric layer 20 may be removed. For example, when a wet etching process is performed on the metal pattern 42, hydrogen peroxide having weight ratio of 65-7.5 with respect to deionized water and sulfuric acid having weight ratio of 5.0-6.0 with respect to deionized water can be used as an etching solution. When a wet etching process is performed on the metal pattern 42, a mixed solution may be used as an etching solution. The mixed solution can include a corrosion inhibitor (e.g., BTA: benzotriazole) and dilute sulfuric acid solution or a solution of $HF:HNO_3(25:1)$. Also, a cleaning process using deionized water can be performed before and after an isotropic etching process.

Figure 5:
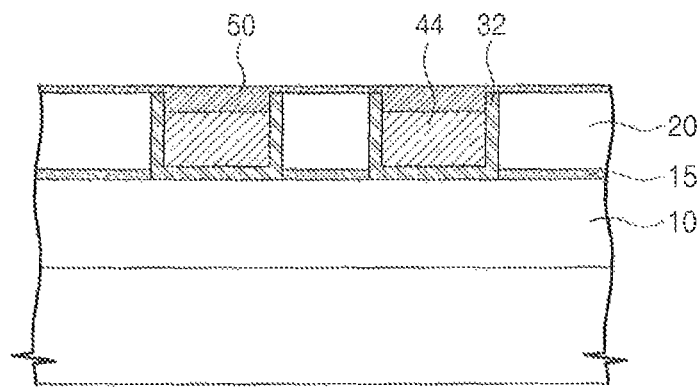

Referring to FIG. 5, a metal capping layer 50 is selectively formed on the low-k dielectric layer 20 including the recessed metal pattern 44. According to one embodiment, the metal capping layer 50 may be ruthenium layer which can be formed using a selective chemical vapor deposition method.

More specifically, the selective chemical vapor deposition method may exhibit different deposition rates depending on the material of the lower layer 10. That is, the metal capping layer 50 may be nonuniformly deposited on the low-k dielectric layer 20 including the recessed metal pattern 44.

In one embodiment, when the ruthenium layer 50 is formed using a selective chemical vapor deposition method, the deposition rate of the ruthenium layer 50 on the recessed metal pattern 44 may be higher than the deposition rate of the ruthenium layer on the low-k dielectric layer 20. That is, the thickness of the ruthenium layer 50 on the recessed metal pattern 44 may be greater than the thickness of the ruthenium layer 50 on the low-k dielectric layer 20.

In one embodiment, one of $Ru(Cp)_2$, $Ru(EtCp)_2$, $Ru(MeCp)_2$, $Ru(tmhd)_3$, $Ru(mhd)_3$, $Ru(Od)_3$, $RuCl_3$, $Ru_3(CO)_{12}$, Ru-acetylacetonate (Ru-AA), $RuO_3$ and $RuO_4$ may be used as the source gas to form the ruthenium layer 50. A selective chemical vapor deposition method may be performed to form the ruthenium layer 50 at a temperature of from about 150° C. to about 250° C. at a low pressure of about 0.1 mT or less.

In one embodiment, the ruthenium layer 50 has a thickness of from about 5 Å to about 50 Å on the recessed metal pattern 44 and a thickness of from about 1 Å to about 10 Å on the low-k dielectric layer 20. Further, the ruthenium layer 50 on the low-k dielectric layer 20 may net be uniformly deposited on all surfaces and may be deposited on the top surface of the low-k dielectric layer 20 in particle form.

Before forming the ruthenium layer 50 using a selective chemical vapor deposition method, a thermal treatment process and a plasma treatment process may be performed. For example, a thermal treatment process may be performed in an atmosphere of Ar gas, $O_2$ gas, $N_2$ gas, a mixed gas of $H_2$ and $N_2$ or a mixed gas of $H_2$ and Ar. The plasma treatment process may be performed in an atmosphere of Ar gas, $O_2$ gas, $O_3$ gas, $N_2$ gas or combinations thereof. The uniformity of deposition of the ruthenium layer 50 may be improved by performing these thermal treatment and the plasma treatment processes.

Figure 6:
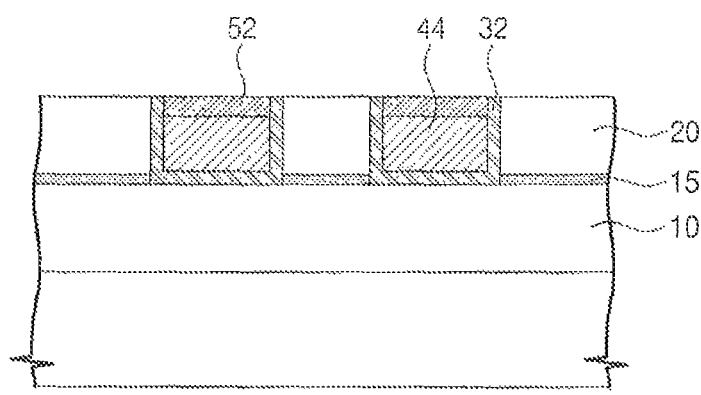

Referring to FIG. 6, a metal capping pattern 52 covering a top surface of the recessed metal pattern 44 can be formed by performing a planarization process on the metal capping layer 50. A chemical mechanical polishing (CMP) process can be used as a planarization process and the planarization process can be performed to expose a top surface of the barrier metal pattern 32 formed in the opening 21. When the planarization process is performed on the metal capping layer 50, a top surface of the low-k dielectric layer 20 can be planarized at the same time. Thus, the metal capping layer 50 formed on a top surface of the low-k dielectric layer 20 can be removed.

The metal capping pattern 52 can be formed on a top surface of each of the recessed metal patterns 44 buried in the opening 21. In one embodiment, a top surface of the metal capping pattern 52 may be coplanar with a top surface of the low-k dielectric layer 20 and a top surface of the barrier metal pattern 32. A sidewall of the metal capping pattern 52 may be surrounded by the barrier metal pattern 32. That is, a sidewall of the metal capping pattern 52 may be directly in contact with an inner sidewall of the barrier metal pattern 32. Thus, the barrier metal pattern 32 may prevent copper atoms in the metal capping pattern 52 and the recessed metal pattern 44 from diffusing to the low-k dielectric layer 20.

Figure 8:
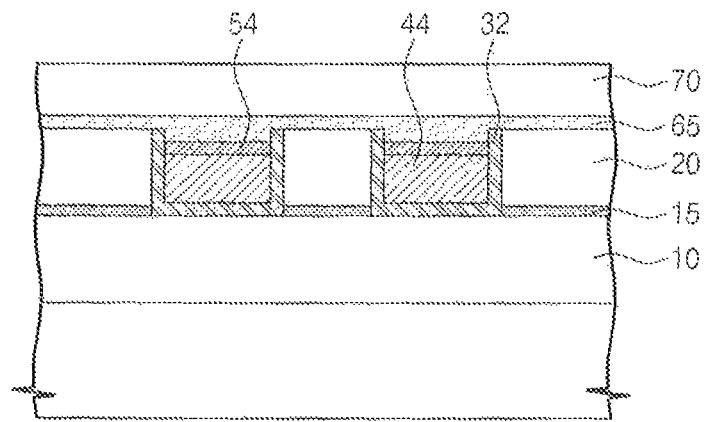

When a planarization process is performed on the metal capping layer 50, a slurry may be chosen such that the removal rate of the metal capping layer 50 is higher than the removal rate of the low-k dielectric layer 20 and the removal rate of the barrier metal pattern 32. In this case, as illustrated in FIG. 8, a top surface of the metal capping pattern 52 is recessed to be lower than the top surface of the low-k dielectric layer 20. That is, the top surface of the metal capping pattern 52 may be located to be lower than the top surface of the barrier meal pattern 32 and a part of an inner sidewall of the barrier metal pattern 32 may be exposed.

Figure 7:
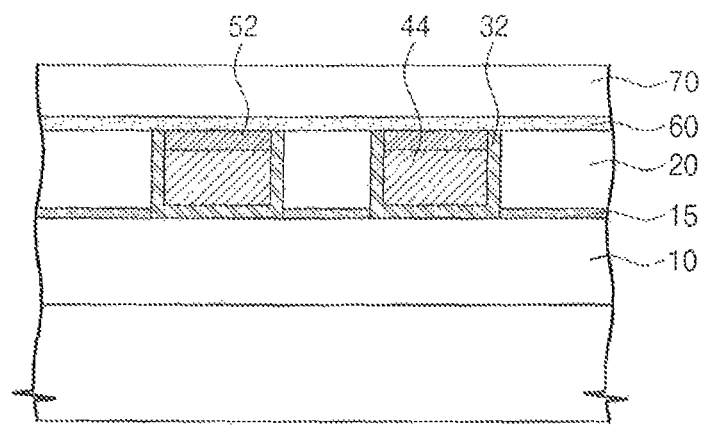

Referring to FIG. 7, a capping insulating layer 60 and an insulating layer 70 are sequentially formed on the low-k dielectric layer 20.

The capping insulating layer 60 can be uniformly formed on top surfaces of the metal capping pattern 52, the barrier metal pattern 32 and the low-k dielectric layer 20. As illustrated in FIG. 8, in the case that a part of an inner sidewall of the barrier metal pattern 32 is exposed by the metal capping pattern 54, a thickness of the capping insulating layer 65 formed on the metal capping pattern 54 may be greater than a thickness of the capping insulating layer 65 formed on the low-k dielectric layer 20.

The capping insulating layer 60 and the insulating layer 70 may be formed using a layer-formation technology such as a chemical vapor deposition (CVD) or an atomic layer deposition (ALD), having a superior property of step coverage.

For example, the capping insulating layer 60 may be formed from $SiO_2$, SiOF, SiC, SiN, SiCN or any combination thereof. The insulating layer 70 may be formed from dielectric material having a dielectric constant lower than the silicon oxide layer. The insulating layer 70 may be a boron-phosphor silicate glass layer, a high density plasma oxide layer or a tetra ethyl ortho silicate layer. The insulating layer 70 may also be formed from undoped silicate glass (USG) material or tonen silazene material.

Since the recessed metal pattern 44 including copper is completely surrounded by the barrier metal pattern 32 and the metal capping pattern 52, copper atoms may be prevented from diffusing to the low-k dielectric layer 20. Due to the metal capping pattern 52 (having a superior connecting power to copper) is formed from ruthenium, oxidation and corrosion of the recessed metal pattern 44 formed from copper may be prevented and the electromigration properties of the recessed metal pattern 44 may be improved by suppressing diffusion of the copper atoms. Further, since the top surface of the metal capping pattern 52 formed from ruthenium is located so as to be level with or lower than the top surface of the low-k dielectric layer 20, a part of ruthenium layer remains on a top surface of the low-k dielectric layer 20 and thereby degradation of reliability may be prevented when the semiconductor device is operated.

Figure 9:
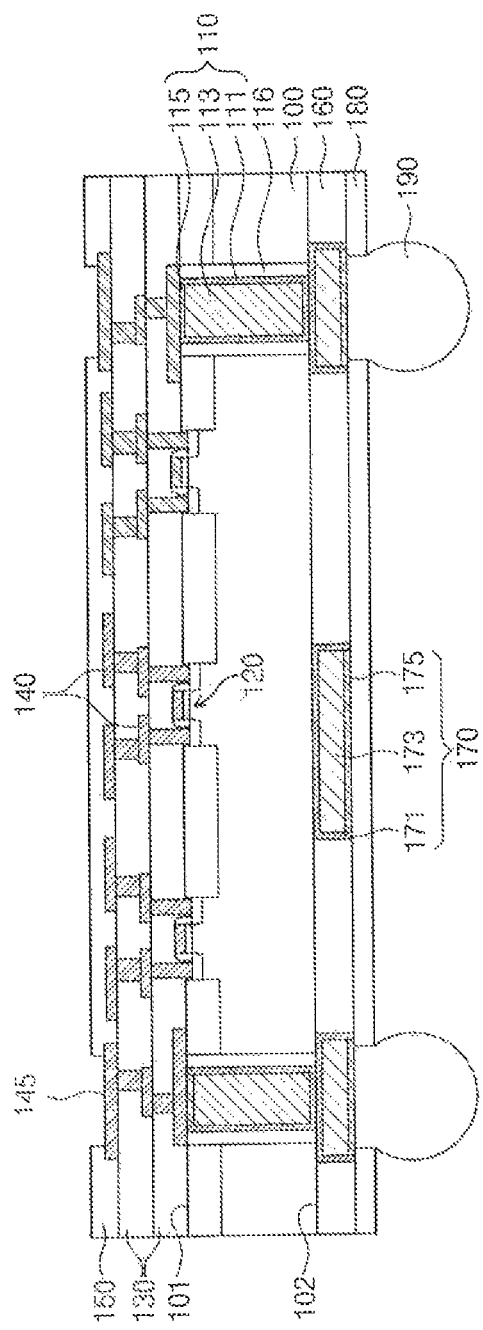
FIG. 9 illustrates a semiconductor package formed using a method of forming a metal interconnection of a semiconductor device in accordance with an embodiment of the inventive concept.

FIG. 9 illustrates a semiconductor package formed using a method of forming a metal interconnection of a semiconductor device in accordance with an embodiment of the inventive concept.

Referring to FIG. 9, the semiconductor package includes a semiconductor substrate 100 having a first side 101 and a second side 102 facing each other and a through via 110 penetrating the semiconductor substrate 100 to connect the first side 101 and the second side 102. Herein, the through via 110, as described with reference to FIGS. 1 through 8, can be comprised of a barrier metal pattern 111, a metal pattern 113 and a metal capping pattern 115. An insulating layer liner 116 can be disposed between the semiconductor substrate 100 and the through via 110. The insulating layer liner 116 may extend on the first side 101 of the semiconductor substrate 100 and can be a silicon oxide layer, a silicon nitride layer or a silicon oxynitride layer.

Semiconductor devices 120 (e.g., a transistor, a capacitor and a resistor) may be disposed on the first side 101 of the semiconductor substrate 100. A plurality of interlayer insulating layers 130 covering the semiconductor devices 120 may be stacked on the first side 101 of the semiconductor substrate 100 and internal interconnections 140 connected to the semiconductor devices 120 may be formed on the interlayer insulating layers 130. The internal interconnections 140 may be electrically connected to patterns (e.g., contact plugs or via plugs) vertically transmitting an electric signal in the semiconductor package. That is, the internal interconnections 140 may be electrically connected to the through via 110 penetrating the semiconductor substrate 100. Also, the interconnection 140 may be electrically connected to patterns to horizontally transmit an electric signal. The internal interconnections 140, as described with reference to FIGS. 1 through 8, may be formed in an opening of a low-k dielectric layer and may be include a barrier metal pattern, a metal pattern and a metal capping pattern.

A bonding pad 145 may be disposed on the uppermost interlayer insulating layer 130 and a part of the bonding pad 145 may be exposed by a passivation layer 150. The bonding pad 145, similar to the internal interconnections 140, may include a barrier metal pattern, a metal pattern and a metal capping pattern and a part of top surface of the metal capping pattern may be exposed by the passivation layer 150. The metal capping pattern (52 of FIG. 7) may prevent oxidation and contamination of the top surface of the metal pattern (44 of FIG. 7). Also, the metal capping pattern may protect the metal pattern from chemical and physical damage or may protect the metal pattern from impurities that may flow into the metal pattern.

Redistributed interconnection patterns 170 may be disposed on the second side 102 of the semiconductor substrate 100 and the redistributed patterns 170 may be electrically connected to the through via 110. The redistributed interconnection patterns 170, as described with reference to FIGS. 1 through 8, may be formed in an opening of a low-k dielectric layer and may include a barrier metal pattern 171, a metal pattern 173 and a metal capping pattern 175.

A passivation layer 180 covering the redistributed interconnection patterns 170 may be disposed on the second side 102 of the semiconductor substrate 100 and the passivation layer 180 may expose a part of the redistributed interconnection patterns 170. The passivation layer 180 may be an organic insulating layer such as polyimide. A solder ball or a solder bump 190 can be adheres to a surface of the redistributed interconnection pattern 170 exposed by the passivation layer 180. That is the solder bump 190 can be directly adhered to a surface of the metal capping pattern 175 of the redistributed interconnection pattern 170.

According to certain embodiments of the inventive concept, when capping a top surface of copper interconnection with a ruthenium layer, the ruthenium layer is removed and none of the ruthenium layer remains on a surface of low-k dielectric layer. Also, diffusion of copper atoms into the insulating layer due to incomplete capping of the top surface of copper interconnection by the ruthenium layer is prevented. Thus, the electromigration properties of the copper interconnection can be improved and the reliability of the semiconductor integrated circuit can be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
    a low-k dielectric layer including an opening;
    a barrier metal pattern conformally covering an inner wall of the opening;
    a metal pattern formed in the opening having the barrier metal pattern;
    a metal capping pattern covering a top surface of the metal pattern formed in the opening; and
    a capping insulating layer covering a top surface of the metal capping pattern and a top surface of the low-k dielectric layer, the capping insulating layer formed of an insulating material different from the low-k dielectric layer,
    wherein a top surface of the metal capping pattern is lower than the top surface of the low-k dielectric layer, wherein the metal pattern comprises copper and the metal capping pattern comprises ruthenium, and
    wherein the capping insulating layer has a first thickness on the top surface of the metal capping pattern and a second thickness on the top surface of the low-k dielectric layer, wherein the first thickness is greater than the second thickness.

2. The device of claim 1, wherein sidewalls of the metal pattern and the metal capping pattern are in direct contact with the barrier metal pattern.

3. The device of claim 1, wherein the low-k dielectric layer is formed from a material having a dielectric constant of from about 2.0 to about 3.5.

4. The device of claim 1, further comprising a conductive structure penetrating a lower layer,
    wherein the low-k dielectric layer is disposed on the lower layer, and the barrier metal pattern is in contact with the conductive structure.

5. The device of claim 1, further comprising a solder ball or a solder bump on a surface of the metal capping pattern.

6. A semiconductor device comprising:
    a low-k dielectric layer including an opening;
    a barrier metal pattern conformally covering an inner wall of the opening;
    a metal pattern formed in the opening having the barrier metal pattern;
    a metal capping pattern covering a top surface of the metal pattern formed in the opening; and
    a capping insulating layer covering a top surface of the metal capping pattern and a top surface of the low-k dielectric layer, the capping insulating layer formed of an insulating material different from the low-k dielectric layer, wherein the metal pattern comprises copper and the metal capping pattern comprises ruthenium, wherein the capping insulating layer has a first thickness on the top surface of the metal capping pattern and a second thickness on the top surface of the low-k dielectric layer, wherein the first thickness is greater than the second thickness.

7. The device of claim 6, wherein the top surface of the metal capping pattern is lower than the top surface of the low-k dielectric layer.

8. The device of claim 6, wherein sidewalls of the metal pattern and the metal capping pattern are in direct contact with the barrier metal pattern.

9. The device of claim 6, further comprising a conductive structure penetrating a lower layer, wherein the low-k dielectric layer is disposed on the lower layer, and the barrier metal pattern is in contact with the conductive structure.

* * * * *